United States Patent [19]
Swanke

[11] Patent Number: 5,564,097
[45] Date of Patent: Oct. 8, 1996

[54] SPREAD INTERMEDIATE FREQUENCY RADIO RECEIVER WITH ADAPTIVE SPURIOUS REJECTION

[75] Inventor: Christopher J. Swanke, Cedar Rapids, Iowa

[73] Assignee: Rockwell International, Seal Beach, Calif.

[21] Appl. No.: 249,485

[22] Filed: May 26, 1994

[51] Int. Cl.⁶ ............................................ H04B 1/10
[52] U.S. Cl. ................. 455/302; 455/63; 455/67.3; 455/285; 455/296; 375/346
[58] Field of Search .................... 455/295, 296, 455/302, 314, 285, 283, 226.1, 50.1, 63, 61, 67.3, 115, 114; 375/296, 346

[56] References Cited

U.S. PATENT DOCUMENTS

| | | |
|---|---|---|
| 4,457,022 | 6/1984 | Dydyk . |
| 4,584,715 | 4/1986 | Baars et al. . |
| 4,592,074 | 5/1986 | Whikehart . |
| 4,718,113 | 1/1988 | Rother et al. . |
| 4,761,828 | 8/1988 | Rinderle . |
| 4,776,039 | 10/1988 | Akaiwa . |
| 5,140,198 | 8/1992 | Atherly et al. . |
| 5,214,796 | 5/1993 | Gorrie et al. . |
| 5,352,984 | 10/1994 | Piesinger .................. 324/532 |

*Primary Examiner*—Andrew Faile
*Assistant Examiner*—Doris To
*Attorney, Agent, or Firm*—Kyle Eppele; M. Lee Murrah; G. A. Montanye

[57] ABSTRACT

A radio receiver in which the received signal is spread and subsequently despread in order to identify unwanted signals. One embodiment of the present invention is comprised of a frequency-hopping spreading synthesizer that operates in synchronization with a despreader synthesizer such that unwanted signals are effectively suppressed based upon different spreading characteristics of the desired and undesired signals. Use of a logic device, in one case a digital signal processor, in combination with a state-level monitor allows for the reconfiguring of the receiver such that a state containing a large interferer can be removed from further signal processing.

11 Claims, 2 Drawing Sheets

SPREAD INTERMEDIATE FREQUENCY RADIO RECEIVER WITH ADAPTIVE SPURIOUS REJECTION

BACKGROUND OF THE INVENTION

The present invention relates to radio communications technology and more particularly to receiver/exciter technology.

At the present time the vast majority of radio receivers are of the superheterodyne type employing one or more intermediate frequency stages which allow for filtering and amplification at fixed frequencies. Alternatives exist to the superheterodyne architecture such as the superregenerative receiver, the direct conversion receiver, and the direct sampling receiver. However, these alternative designs have been subject to serious flaws which have relegated radio receivers of these types to specialty roles within the radio communications world.

A typical heterodyne receiver is comprised of translators that perform one or more conversions of the received signal to an intermediate frequency (IF) that can then be more readily processed for information content of the carrier wave. The heterodyne receiver requires the use of one or more local oscillators and associated filters, amplifiers and mixers to process the received signal. Undesired spectral signals or spurs can corrupt the processing of the desired signal. Spurs such as a mixer image signal or higher order product must be countered in order to process the desired signal. The intermediate frequencies chosen and the filtering at each translation determine the level of rejection of spurious signals.

The mixer circuit in a superheterodyne radio receiver translates a signal received at one frequency to another frequency, termed an intermediate frequency (IF). Undesired signals at the mixer input can also be translated onto the same intermediate frequency. These undesired signals or spurs can be located at the image frequency of the mix or at frequencies whose higher order products of the non-linear mix produce the same intermediate frequency as the desired signal. Superheterodyne receivers are typically designed with multiple conversions in which each conversion is protected by a filter and avoids spurious signals. The final conversion produces an intermediate frequency that can be demodulated. High performance superheterodyne receivers may require four or more conversions with associated filtering and amplification to reject spurious signals.

Partly in order to avoid the above described problems, designers have utilized direct conversion receivers. While direct conversion receivers avoid the multiple conversion problems of superheterodyne receivers other drawbacks exist. One such type of problem is described as local oscillator leakage. Since the local oscillator and the tuned frequency are the same, the receiver is unable to filter the local oscillator signal. To minimize the effects of oscillator leakage designers have relied upon the use of additional components, like amplifiers, in reverse isolation fashion in order to minimize its effects. Other problems such as direct current offsets, hum susceptibility, microphonics, quadrature I and Q balance, and direct undesired amplitude modulation detection are also present in typical direct conversion receivers. Accordingly, a need exists for a simplified approach to signal processing that eliminates the drawbacks of the prior art solutions.

SUMMARY OF THE INVENTION

The present invention provides an apparatus and method for processing radio signals. Comprised of an input stage for receiving a signal in a desired frequency range having desired and undesired components, a mixer coupled to said input stage for translating the desired received radio channel, and a signal spreader coupled to the mixer for spreading the desired signal into a predetermined intermediate frequency band. A second mixer is utilized to translate or despread the spread intermediated frequency signal into a single intermediate frequency or to baseband quadrature components for demodulation. Synchronization circuitry controls the timing and delay equalization between the spreading mixer injection and the despreading injection. A state level monitor is utilized to compare levels of incoming despread intermediate frequency or baseband states. If a state is recognized as being corrupted by a large interferer, then that state is removed from the spreading sequence.

In one embodiment of the present invention the spreader is a frequency-hopping synthesizer. After frequency spreading, the resultant IF is passed through an anti-aliasing filter and digitized. Utilizing a digital signal processor, the desired signal in the IF is tracked and despread into baseband in-phase and quadrature-phase components. The levels of despread states are also monitored within the digital signal processor for large interferers.

It is an object of the present invention to provide a radio receiver better able to process desired signals.

It is a feature of the present invention to utilize synchronized spreading and despreading of a received radio signal in order to track the desired signal.

It is an advantage of the present invention that a radio receiver for processing received signals is comprised of fewer components than prior art apparatus.

These and other objects, features and advantages are disclosed and claimed in the specification, figures and claims of the present application.

DETAILED DESCRIPTION

Figure 1:
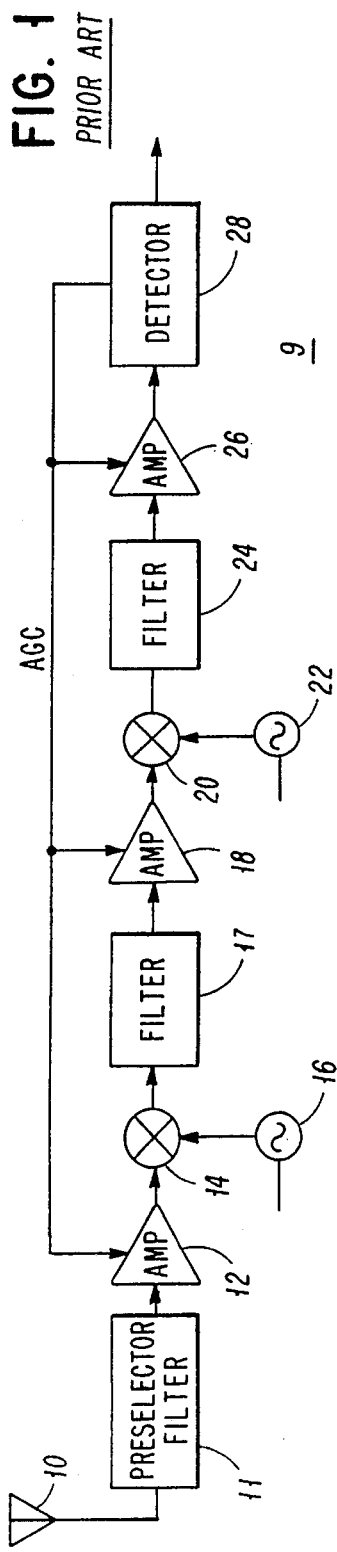
FIG. 1 is a block diagram of a superheterodyne receiver, as known in the prior art.

Turning now to the drawings wherein like items are referenced as such throughout, FIG. 1 illustrates a block diagram of a prior art superheterodyne receiver 9. An antenna 10 collects propogated signals and routes such signals through a preselector filter 11, a first amplifier 12 and to a mixer 14. The mixer 14 injection signal comes from a local oscillator 16 and routes a first intermediate frequency, typically the sum or difference of the mixed signals, to a second mixer via a filter 17 and a second amplifier 18. The mixer 20 accomplishes a second conversion of the original signal and routes its output to a detector 28. Although depicted as a dual conversion superheterodyne receiver, it is well understood that more esoteric configurations are utilized dependent upon design requirements for spurious signal rejection.

Figure 2:
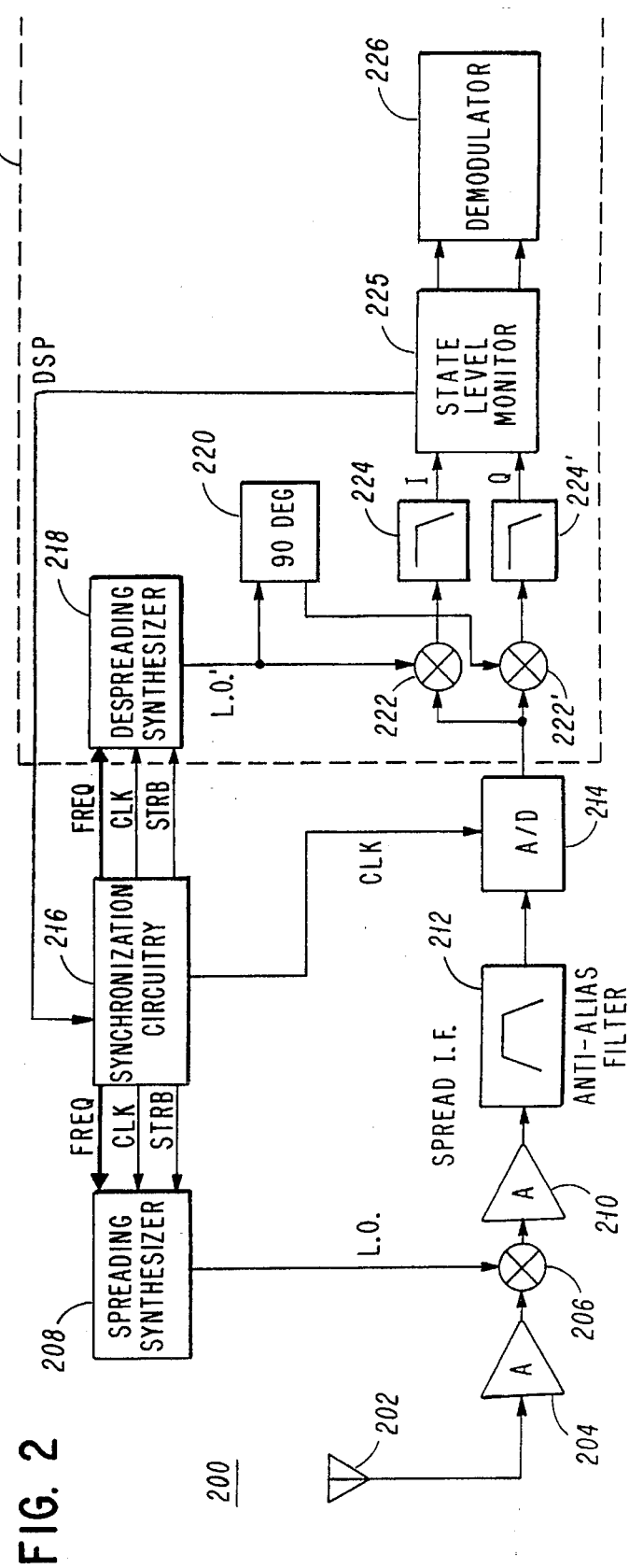
FIG. 2 is a block diagram of a receiver incorporating the teachings of the present invention.

Referring to FIG. 2, a block diagram of a radio 200 that incorporates the teachings of the present invention is illustrated. An antenna 202 collects local radio signals and couples such signals to a mixer 206 via an amplifier 204. The mixer 206 combines the received signal with an injection signal from a spreading synthesizer 208. The spreading synthesizer 208 provides a spread injection signal to the mixer 206, such as a frequency-hopped or pseudo-random signal. The mixer 206 produces an intermediate frequency signal that is amplified via an amplifier 210, filtered by a filter 212 and subsequently converted to a digital equivalent by the analog-to-digital converter 214. The digitized output signal of the converter 214 is coupled to a pair of mixers 222, 222' that combine the $IF_I$ and $IF_Q$ signals with a synthesized signal from a despreading synthesizer 218 that is reflective of the signal generated by the spreading synthesizer 208 and synchronized with such signals via a synchronizer 216. A phase shifter 220 is disposed between the despreading synthesizer 218 and the mixer 222' for providing a quadrature signal to the mixer 222'. The outputs of the mixers 222, 222' are filtered, despread states are then coupled to a state level monitor 225 and subsequently to a demodulator 226. It should be noted that the despreading synthesizer 218, the phase shifter 220, the mixers 222, 222', the filters 224, 224', the state level monitor 225, and the demodulator 226 may be incorporated into a digital signal processor 228.

In operation the radio of FIG. 2 injects a spread IF signal into the mixer 206. In order for the spread approach to be effective for interference suppression the frequency in which the spreading injection is varied must be faster than the bandwidth of the desired signal (i.e. over-sampling the desired signal) and the step-size of the spreading injection must be larger than half the bandwidth of the desired signal to avoid having an interferer corrupt more than one state in the spreading sequence.. Utilizing digital signal processing technology, the desired signal in the IF is tracked and despread into baseband I and Q components. This is accomplished by synchronizing the output signals of the synthesizers 208, 218. The in-phase and quadrature-phase signals are filtered to recreate the desired signal. The interference is effectively suppressed due to the fact that it will always have a different spreading pattern in the IF than the desired signal. Thus, the spread IF approach achieves cancellation by spreading the spurious energy over a number of spreading states. The number of the spreading states determines the level of spurious suppression and also dictates the bandwidth of the spread IF signal.

In addition to the enhancements obtained by virtue of spreading and despreading, the present disclosure also provides for the receiver to reconfigure itself upon identification of a large interferer located in a desired signal state. By monitoring the over-sampled despread states, via the state level monitor 225 in conjunction with the DSP 228 or other means, and comparing the current state with previous states, it is possible to recognize large interferers within the IF signal. A state containing such an interferer can then be removed from the spreading sequence thereby eliminating the interferer. Smaller interferers which cannot be easily recognized by comparing states are suppressed via the above described spread IF processing gain. This then reduces the number of spreading states required in the design to the number needed to suppress the interferers which cannot be recognized in the DSP.

Figure 3A:
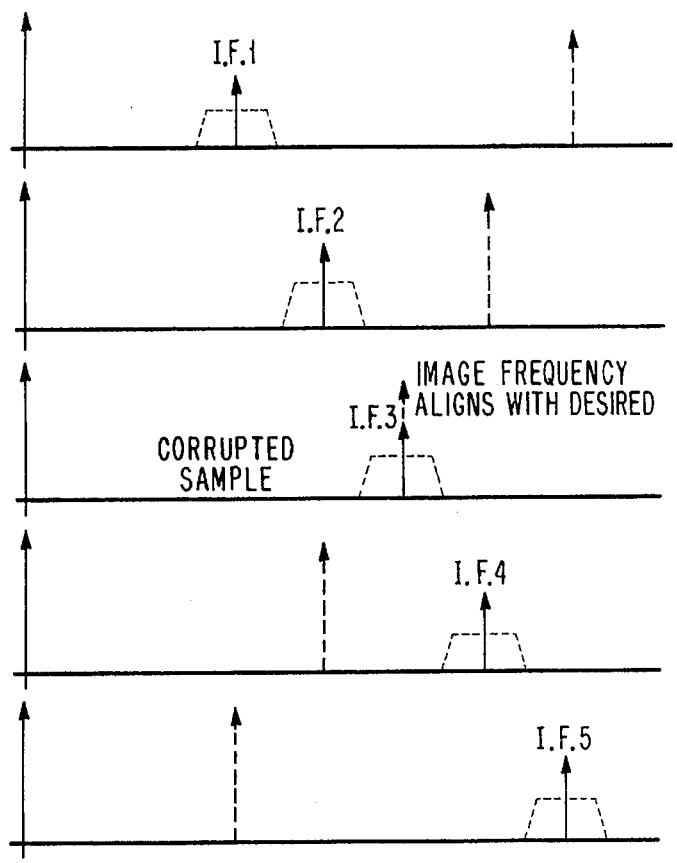
FIGS. 3A and 3B are graphical representations of a frequency-hopped signal in a spread and despread state, such as taught by the present invention in a system that has a five hopping-state spreading sequence.
Figure 3B:
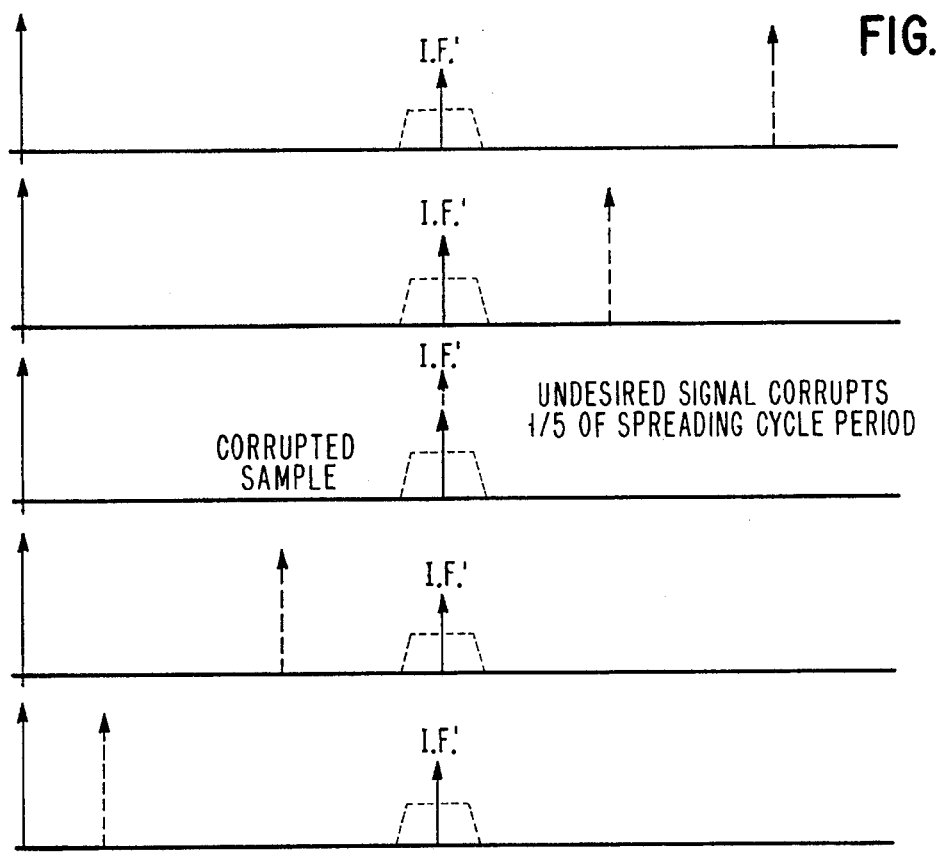

FIGS. 3A and 3B are graphical examples of a processed signal in a receiver utilizing the teachings of the present invention with a five-state frequency-hopping sequence. FIG. 3A illustrates the spreading sequence of a received signal. FIG. 3B illustrates despreading sequence of the received signal of FIG. 3A. The spreading synthesizer is continuously hopped over five predetermined frequencies, thereby producing the spread IF signal. An interferer is shown which produces an image that falls on the desired IF signal on the third hop of the five-hop cycle. The frequency spreading reduces the time that the desired signal and the interferer can occupy the same IF. Thus, with five-hop frequency spreading, the interferer's effective energy is reduced by four-fifths or eighty percent. Measurements from such a receiver indicate that the interfering signal is reduced in accordance with the following equation: 20 log X dB, where X is the number of frequency hopping states in the spreading sequence. In this example the value of X is 5 and the image response would be reduced by 20 log 5, or 14 dB. Higher order mixer responses would have additional reduction due to the inherent balance of the mixer.

It should also be noted that by reversing the spreading and despreading process a spurious suppressed exciter injection can be produced. The DSP produces a spread signal which would then be translated and despread by a mixer with a tracking synthesizer signal. This process suppresses the spurious signals along with the image signal which is normally produced in the translation. Modulation can be produced either by the DSP or the synthesizer and will not be adversely affected by the spreading or despreading process. Amplifiers for power and modulation well-known in the prior art and not shown in the receiver block diagram of FIG. 2 would also be utilized in a transmitter implementing the spreading and despreading approach of the present invention.

Those skilled in the art will readily recognize that various modifications and changes may be made to the present invention without departing from the true spirit and scope thereof, which is set forth in the following claims.

I claim:

1. A radio receiver comprising:

an input stage for receiving a radio signal composed of a desired signal in a first selected frequency range and an undesired disturbance signal;

paired spreading and despreading synthesizers coupled to the radio signal;

a detector for identifying undesired signals within operating parameters of the receiver; and a processor for interpreting an output signal from the detector and reconfiguring the receiver to inhibit the undesired disturbance signals.

2. A radio receiver comprising:

an input stage having an antenna for receiving a radio signal composed of a desired signal in a first selected frequency range and an undesired disturbance signal;

a first mixer coupled to said input stage for converting the received radio signal into a frequency signal in a second selected frequency range;

a signal spreader coupled to the first mixer for spreading a desired intermediate frequency about a selected center frequency;

a pair of mixers forming a first channel for processing the in-phase component of the first mixer output signal and a second channel for processing the quadrature-phase component of the first mixer output signal;

a signal despreader for removing the spreading introduced to the first mixer coupled to the paired mixers; and a synchronizer coupled to the spreader and the despreader to account for timing differences and delay equalization.

3. The apparatus of claim 2, wherein the signal spreader is a frequency-hopping spreader.

4. The apparatus of claim 3, wherein the undesired disturbance signal is reduced in accordance with the following: 20 log X dB, where X equals the number of frequency hops per cycle.

5. The apparatus of claim 2, wherein the signal spreader is a pseudo-random spreader.

6. The apparatus of claim 2 wherein frequency leakage out the antenna is reduced without the use of additional isolation components.

7. The apparatus of claim 2, further comprising a monitor having a predetermined threshold for detecting an interfering signal in any given state of the spread signal; and
 a means coupled to the monitor for subsequent rejection of interfering signal states which have been identified.

8. The apparatus of claim 2 further including an amplifier, a filter and an analog-to-digital converter coupled between the first mixer and the pair of mixers.

9. The apparatus of claim 8, wherein the filter coupled between the amplifier and the analog-to-digital converter is an anti-aliasing filter.

10. The apparatus of claim 2 in which the spread desired signal in the intermediate frequency is less susceptible to direct interfering signals, due to the quantity of spread intermediate frequency states and their processing gain against said interfering signals.

11. The apparatus of claim 2 in which non-linear receiver circuitry distortion is reduced by the signal spreader and signal despreader.

* * * * *